US008878527B2

(12) United States Patent
Sessego et al.

(10) Patent No.: US 8,878,527 B2
(45) Date of Patent: Nov. 4, 2014

(54) MAGNETIC FIELD SIMULATOR FOR TESTING SINGULATED OR MULTI-SITE STRIP SEMICONDUCTOR DEVICE AND METHOD THEREFOR

(75) Inventors: Raimondo Sessego, Chandler, AZ (US); Gerard John, Chandler, AZ (US); Pete Duchine, Chandler, AZ (US)

(73) Assignee: Amkor Technology, Inc., Chandler, AZ (US)

( * ) Notice: Subject to any disclaimer, the term of this patent is extended or adjusted under 35 U.S.C. 154(b) by 654 days.

(21) Appl. No.: 12/955,509

(22) Filed: Nov. 29, 2010

(65) Prior Publication Data

US 2012/0133386 A1    May 31, 2012

(51) Int. Cl.
*G01R 33/02* (2006.01)
*G01R 33/00* (2006.01)

(52) U.S. Cl.
CPC .................. *G01R 33/0035* (2013.01)
USPC ........... 324/244; 324/234; 324/235; 324/238; 324/762.01; 257/48; 360/313

(58) Field of Classification Search
USPC ................. 324/234, 235, 238, 240, 244, 252, 324/762.01
See application file for complete search history.

(56) References Cited

U.S. PATENT DOCUMENTS

| 2006/0049823 | A1* | 3/2006 | Suzuki ........................ 324/202 |
| 2009/0115440 | A1 | 5/2009 | Bergmann |
| 2009/0153138 | A1* | 6/2009 | Theuss ........................ 324/251 |
| 2010/0019786 | A1 | 1/2010 | Potok et al. |
| 2011/0204359 | A1* | 8/2011 | Furumiya et al. .............. 257/48 |
| 2012/0151786 | A1* | 6/2012 | Ohmori et al. .................. 33/361 |

FOREIGN PATENT DOCUMENTS

JP          2000-088915       3/2000
WO        WO 2010134348 A1 * 11/2010

* cited by examiner

*Primary Examiner* — Arleen M Vazquez
*Assistant Examiner* — Son Le
(74) *Attorney, Agent, or Firm* — McAndrews, Held & Malloy

(57) ABSTRACT

A system for testing a magnetic sensor has a plurality of coils, wherein the coils are positioned along perpendicular planes. A magnetic field is generated along each of the perpendicular planes when a current is sent to each of the plurality of coils.

20 Claims, 4 Drawing Sheets

MAGNETIC FIELD SIMULATOR FOR
TESTING SINGULATED OR MULTI-SITE
STRIP SEMICONDUCTOR DEVICE AND
METHOD THEREFOR

FIELD OF THE INVENTION

This invention relates in general to semiconductor device testing, and, more specifically, to a system and method for testing semiconductor devices having magnetic sensing individually or in strip configuration.

BACKGROUND OF THE INVENTION

Semiconductor devices generally are tested to ensure that they are functioning properly. Semiconductor devices may be tested by inserting the semiconductor device into a test socket having electrical connections. Different test signals may be sent to the test socket in order to check the functionality of the semiconductor device under various connections. If the integrated circuit incorporates a sensing element, the testing may also include applying a suitable stimulus to the sensing element and monitoring the output voltages, signals or loads of the integrated circuit.

For a semiconductor device having a magnetic sensor, one method for testing the functionality of the magnetic sensor is to use a magnetic core to apply test differential magnetic fields to the magnetic sensor, and measure the sensor response. In general, a stepper motor is used to move a calibrated magnet about the semiconductor device. One problem with using such an external magnetic field source is that the present system is a mechanical based system wherein the magnetic needs to be moved around the semiconductor device being tested. There must be a precise alignment between the magnetic core and the sensor under test. Position errors can result in inaccurate test results. Furthermore, this type of testing may only be done after the semiconductor device has been singulated.

Therefore, a need existed to provide a system and method to overcome the above problem.

BRIEF DESCRIPTION OF THE DRAWINGS

Common reference numerals are used throughout the drawings and detailed description to indicate like elements.

DETAILED DESCRIPTION

A system for testing a magnetic sensor has a plurality of coils, wherein the coils are positioned along perpendicular planes. A magnetic field is generated along each of the perpendicular planes when a current is sent to each of the plurality of coils.

A system for testing a semiconductor device having a magnetic sensor has a first coil positioned along an X-axis of the semiconductor device. A second coil is positioned along a Y-axis of the semiconductor device. A third coil is positioned along a Z-axis of the semiconductor device.

Figure 1:
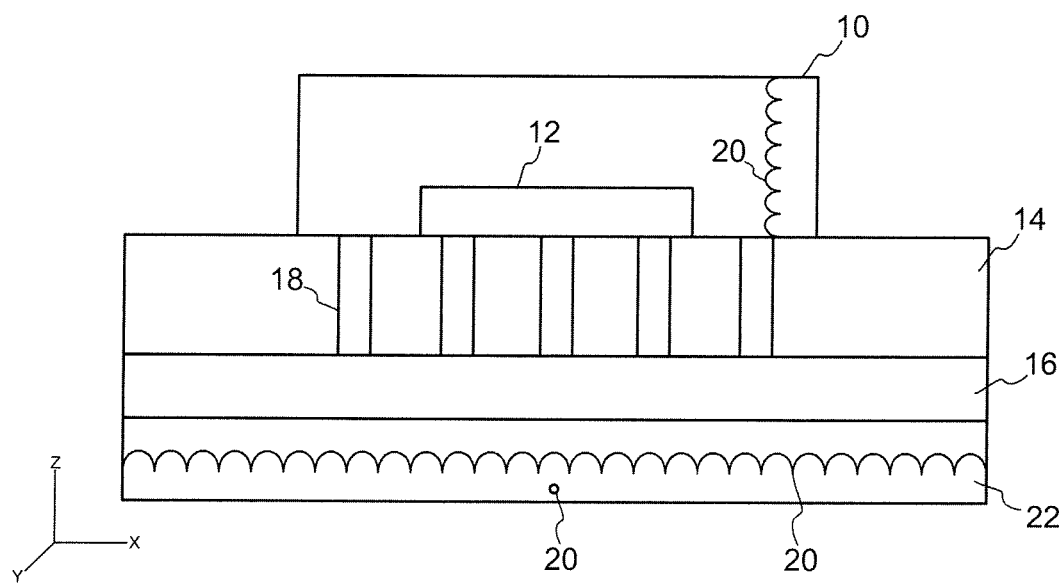
FIG. 1 is a cross-sectional side view of a system for testing a semiconductor device having a magnetic sensor.

Referring now to FIG. 1, a semiconductor device 10 having a magnetic sensor 12 is shown. The semiconductor device 10 is positioned on a test board 14. The test board 14 is generally a printed circuit board (PCB) or the like. The test board 14 is generally connected to a testing device 16 which sends test signals to the semiconductor device 10 via the test board 14. In general, connectors 18 may be used to send the test signals to and from the semiconductor device 10 and the testing device 16. The connectors may be pogo pins or the like. The listing of the above is given as an example and should not be seen in a limiting manner.

A plurality of coils 20 may be positioned around the semiconductor device 10. In the embodiment shown, the coils 20 may be positioned along perpendicular axes of the semiconductor device 10. The coils 20 may be positioned along an X-axis, a Y-axis and a Z-axis of the semiconductor device 10. The coils 20 may be free standing coils; positioned on a substrate or circuit board; placed in an enclosure; formed within the semiconductor device; or the like. The listing of the above is given as an example and should not be seen in a limiting manner.

Figure 2:
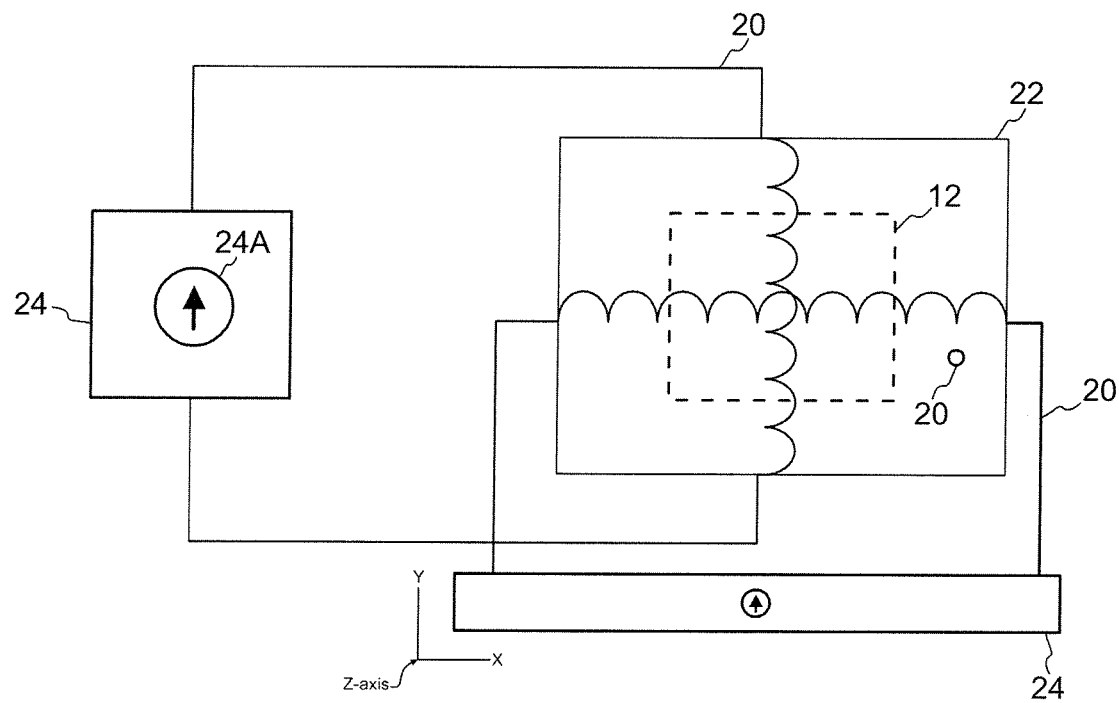
FIG. 2 is a bottom view of the system of FIG. 1.

In the embodiment shown in FIGS. 1-2, the coil 20 along the Z-axis is positioned within the semiconductor device 10. The coils 20 along the X-axis and Y-axis are positioned on a separate substrate 22. While FIGS. 1 and 2 show the coils 20 along the X-axis and Y-axis positioned on the substrate 22 below the semiconductor device 10, this is shown as an example and should not be seen in a limiting manner. Again, the showing of the position of the coils in FIGS. 1-2 is shown as one example, and should not be seen in a limiting manner.

The coils 20 may be coupled to a control unit 24. In accordance with one embodiment, the control unit is an adjustable current source 24A coupled to each coil 20. The control unit 22 may be used to send a current through the individual coils 20. The current level sent through the individual coils 20 may be used to generate a magnetic field along the selected plane. Thus, a current sent through the coil 20 along the X-axis may be used to generate a magnetic field along the X-axis. Similarly, a current sent through the coil 20 along the Y-axis may be used to generate a magnetic field along the Y-axis and a current sent through the coil 20 along the Z-axis may be used to generate a magnetic field along the Z-axis. Thus, the system may be used to excite the magnetic sensor 12 along three different axes. By controlling the magnetic field around the semiconductor device 10, one may be able to cancel the earth's magnetic field thereby creating a zero gauss chamber.

Figure 3:
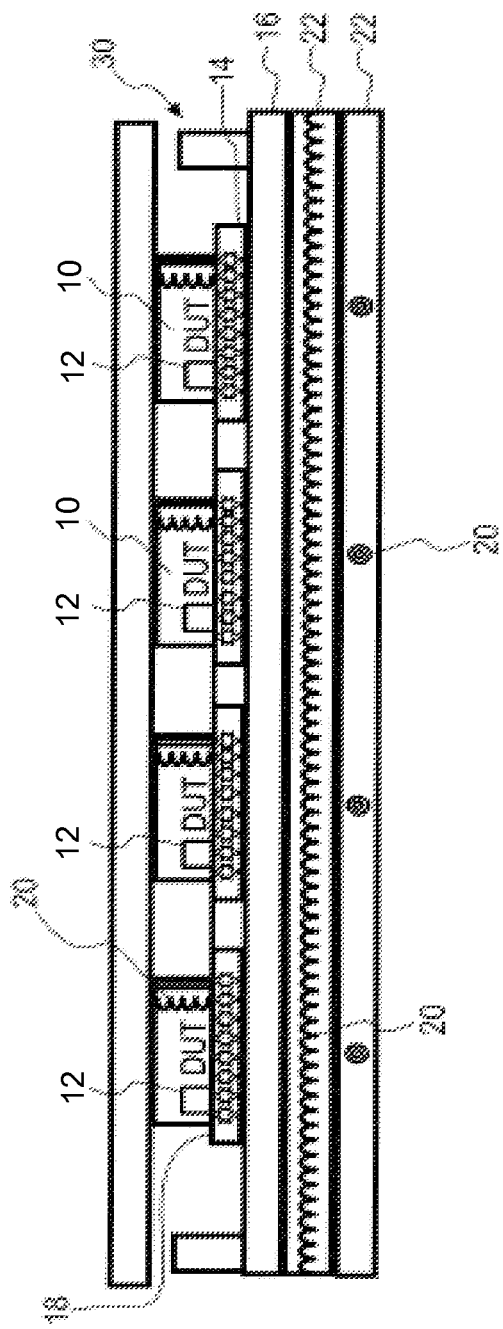
FIG. 3 is cross-sectional side view of the system of FIG. 1 configured to test a strip of semiconductor devices having a magnetic sensor.
Figure 4:
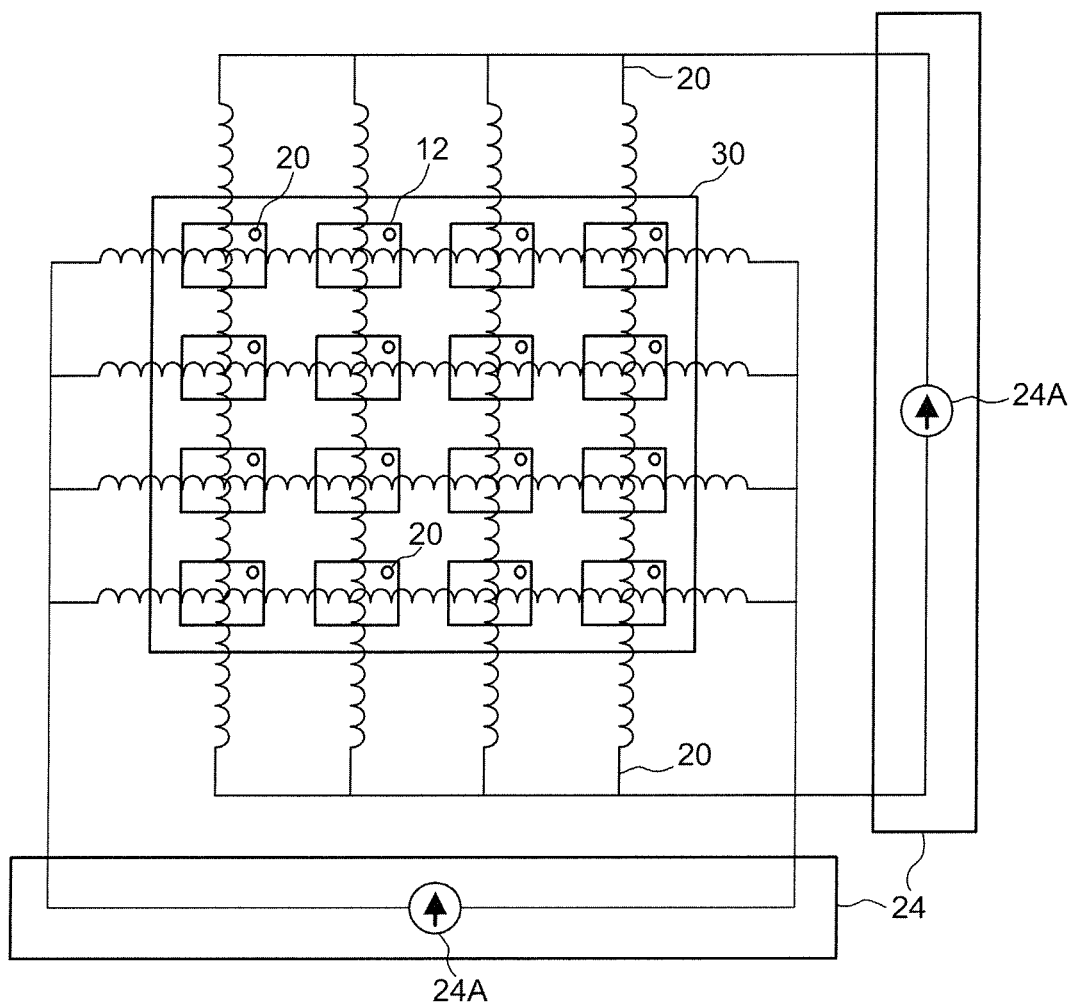
FIG. 4 is a bottom view of the system shown in FIG. 3.

Referring now to FIGS. 3 and 4, another embodiment of the present invention is shown. In this embodiment, a system is shown which test a strip 30 of semiconductor devices 10 having magnetic sensors 12. The strip 30 of semiconductor device 10 is positioned on a test board 14. The test board 14 is generally a printed circuit board (PCB) or the like. The test board 14 is generally connected to a testing device 16 which sends test signals to the semiconductor device 10 via the test board 14. In general, connectors 18 may be used to send the test signals to and from the semiconductor device 10 and the testing device 16.

A plurality of coils 20 may be positioned around the strip 30. In the embodiment shown, the coils 20 may be positioned along perpendicular axes of each of the semiconductor devices 10. The coils 20 may be positioned along an X-axis, a Y-axis and a Z-axis of each of the semiconductor devices 10. The coils 20 may be free standing coils; positioned on a substrate or circuit board; placed in an enclosure; formed within the semiconductor device; or the like. The listing of the above is given as an example and should not be seen in a limiting manner.

In the embodiment shown in FIGS. 3 and 4, the coil 20 along the Z-axis is positioned within each of the semiconductor devices 10. The coils 20 along the X-axis and Y-axis are positioned on a separate substrate 22. In accordance with the embodiment shown in FIGS. 3 and 4, the number of coils 20 positioned along the Y-axis may be equal to the number of columns of semiconductor devices 10 on the strip 30. In the present embodiment, four columns are shown, so the number of coils 20 positioned along the Y-axis may be equal to four. In a similar manner, the number of coils 20 positioned along the X-axis may be equal to the number of rows of semiconductor devices 10 on the strip 30. In the present embodiment, four rows are shown, so the number of coils 20 positioned along the X-axis may be equal to four.

While FIGS. 3 and 4 show the coils 20 along the X-axis and Y-axis positioned on the substrates 22 below the semiconductor device 10, this is shown as an example and should not be seen in a limiting manner. Again, the showing of the position of the coils in FIGS. 3 and 4 is shown as one example, and should not be seen in a limiting manner.

The coils 20 may be coupled to a control unit 22. The control unit 22 may be used to send a current through the individual coils 20. In accordance with one embodiment, the control unit 22 is one or more adjustable current sources 24A. The current level sent through the individual coils 20 may be used to generate a magnetic field along the selected plane. Thus, a current sent through the coils 20 along the X-axis may be used to generate a magnetic field along the X-axis. Similarly, a current sent through the coils 20 along the Y-axis may be used to generate a magnetic field along the Y-axis and a current sent through the coil 20 along the Z-axis may be used to generate a magnetic field along the Z-axis. Thus, the system may be used to excite the magnetic sensor 12 along three different axes. In accordance with one embodiment, the coils 20 may each be individually controlled. Alternatively, the control unit 20 may be designed so that the same current level is sent to all the coils 20 along a certain axis, i.e., all of the coils 20 along the X-axis are energized with the same current level, all the coils 20 along the Y-axis are energized with the same current level, and all the coils 20 along the Z-axis are energized with the same current level. By controlling the magnetic field around the semiconductor device 10, one may be able to cancel the earth's magnetic field thereby creating a zero gauss chamber.

Figure 5:
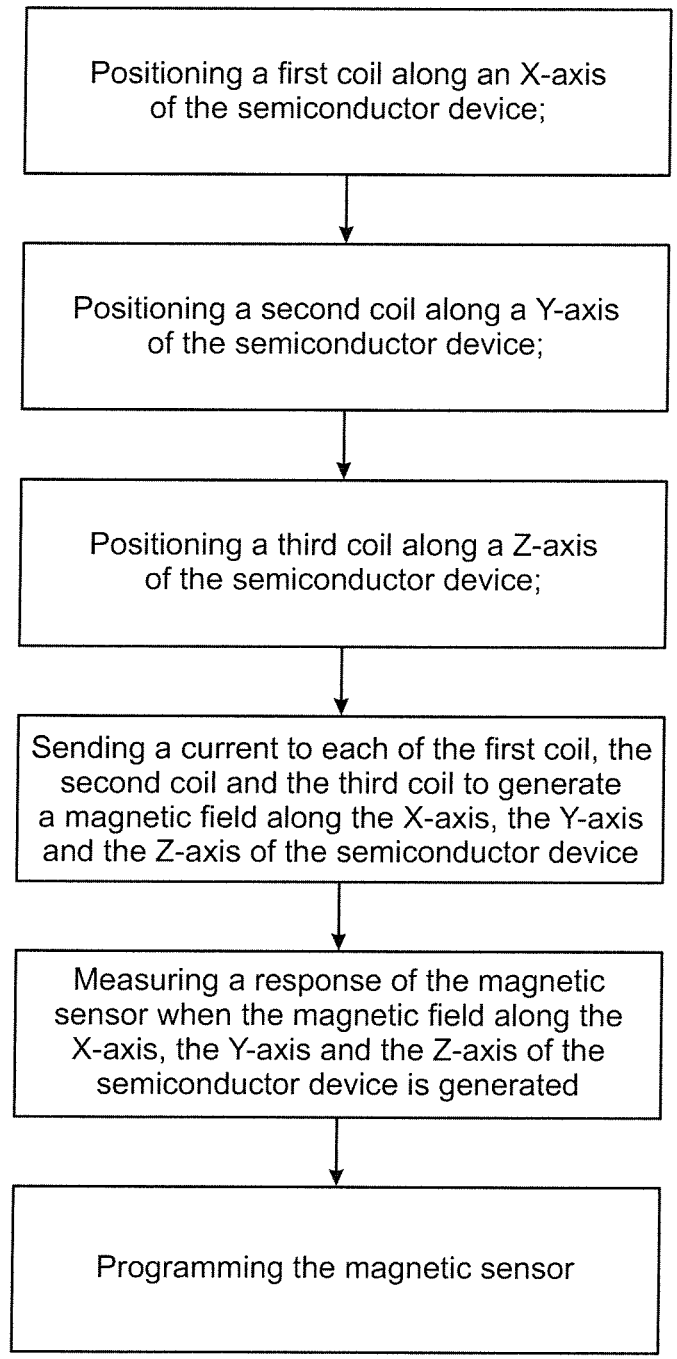
FIG. 5 is a flow chart showing a method of using the system for testing a semiconductor device having a magnetic sensor.

Referring now to FIG. 5, in operation, the tester may first send a predetermined current level to the coils 20 along a first axis. The current level would be sufficient to excite the magnetic sensor 12. Readings are then taken to measure the response of the magnetic sensor 12. The current level in the coils 20 along the first axis may be changed to adjust the magnetic field generated. Once the readings are taken along a first axis, the tester may then send a predetermined current level to the coils 20 along a second axis. Readings are then taken to measure the response of the magnetic sensor 12. The current level in the coils 20 along the second axis may be changed to adjust the magnetic field generated. Once the readings are taken along a first axis, the tester may then send a predetermined current level to the coils 20 along a third axis. Readings are then taken to measure the response of the magnetic sensor 12. The current level in the coils 20 along the third axis may be changed to adjust the magnetic field generated. The readings taken along the three axis of the one or more semiconductor devices 10 may then be used to program the magnetic sensor 12 so that the magnetic sensors 12 provided accurate measurements.

The present invention provides the ability to replace mechanical magnetic stimulus test systems with a solid state electrical stimulus system. This provides a more reliable system with fewer breakdowns and fewer failures. The current system and method further reduces cost as since special mechanical handlers are not required. The present system and method further allows one to test and trim semiconductor devices with magnetic sensors in a strip configuration, thus allowing one to test multiple semiconductor devices at one time.

This disclosure provides exemplary embodiments of the present invention. The scope of the present invention is not limited by these exemplary embodiments. Numerous variations, whether explicitly provided for by the specification or implied by the specification, such as variations in structure, dimension, type of material and manufacturing process may be implemented by one of skill in the art in view of this disclosure.

What is claimed is:

1. A system for testing magnetic sensors the system comprising:
    a plurality of test coils, comprising a test coil positioned within each semiconductor device of an array of semiconductor devices, a test coil positioned along each row of semiconductor devices in the array of semiconductor devices, and a test coil positioned along each column of semiconductor devices in the array of semiconductor devices, each semiconductor device of the array comprising a magnetic sensor, and wherein the test coils are positioned along perpendicular planes;
    wherein a magnetic field is generated along each of the perpendicular planes for each semiconductor device of the array when a current is sent to each of the plurality of test coils.

2. The system of claim 1, further comprising a control unit coupled to the plurality of test coils for each semiconductor device of the array for sending the current to each of the plurality of test coils to generate the magnetic field along each of the perpendicular planes.

3. The system of claim 1, wherein the plurality of test coils are positioned along an X-axis, a Y-axis, and a Z-axis of each a semiconductor device of the array having the magnetic sensor.

4. The system of claim 3, wherein the test coil positioned along the Z-axis of each of the semiconductor devices of the array is positioned within the semiconductor device adjacent to the magnetic sensor.

5. The system of claim 3, wherein the test coils positioned along the X-axis and the Y-axis of each of the semiconductor devices of the array are positioned below the semiconductor device.

6. The system of claim 3, further comprising a substrate for positioning the test coils along the X-axis and the Y-axis of each of the semiconductor devices of the array.

7. The system of claim 1, wherein the plurality of test coils are positioned along an X-axis, a Y-axis, and a Z-axis of a plurality of semiconductor devices on a strip.

8. The system of claim 7, wherein at least one test coil is positioned in each semiconductor device along the Z-axis of each of the semiconductor devices of the array.

9. The system of claim 7, wherein the plurality of semiconductor devices are positioned in a matrix having a defined number of rows and columns, wherein the number of test coils along the X-axis is equal to the number of rows in the matrix.

10. The system of claim 7, wherein the plurality of semiconductor devices are positioned in a matrix having a defined number of rows and columns, wherein the number of test coils along the Y-axis is equal to the number of columns in the matrix.

11. A system for testing semiconductor devices the system comprising:
- a first test coil positioned along an X-axis of each row of semiconductor devices of an array of semiconductor devices, each semiconductor device of the array comprising a magnetic sensor;
- a second test coil positioned along a Y-axis of each column of semiconductor devices of the array of semiconductor devices; and
- a third test coil positioned along a Z-axis of within each semiconductor device of the array of semiconductor devices.

12. The system of claim 11, further comprising a control unit coupled to the first test coil, the second test coil, and the third test coil positioned along the axes of each semiconductor device of the array of semiconductor devices for sending a current to each test coil to generate magnetic fields.

13. The system of claim 12, wherein the control unit comprises a plurality of current sources.

14. The system of claim 11, wherein the third test coil positioned along the axes of each semiconductor device of the array of semiconductor devices is positioned within the semiconductor device adjacent to the magnetic sensor.

15. The system of claim 11, wherein the first coil and the second test coil positioned along the axes of each semiconductor device of the array of semiconductor devices are positioned below the semiconductor device.

16. The system of claim 11, wherein the first test coil and the second test coil positioned along the X and Y axes of each semiconductor device of the array of semiconductor devices are positioned on a substrate below the semiconductor device.

17. A method of testing semiconductor devices the method comprising:
- positioning a first test coil along an X-axis of each row of semiconductor devices of an array of semiconductor devices;
- positioning a second test coil along a Y-axis of each column of semiconductor devices of the array of semiconductor devices;
- positioning a third test coil along a Z-axis of within each semiconductor device of the array of semiconductor devices;
- sending a current to each of the first test coil, the second test coil, and the third test coil of each semiconductor device of the array of semiconductor devices to generate a magnetic field along the X-axis, the Y-axis and the Z-axis of each of the array of semiconductor devices; and
- measuring a response of the magnetic sensor of each semiconductor device of the array of semiconductor devices when the magnetic field along the X-axis, the Y-axis and the Z-axis of each semiconductor device of the array of semiconductor devices is generated.

18. The method of claim 17, further comprising programming the magnetic sensor.

19. The method of claim 17, wherein positioning a third test coil along a Z-axis of each semiconductor device of the array of semiconductor devices further comprises placing the third test coil within each of the semiconductor devices adjacent to the magnetic sensor.

20. The method of claim 17, further comprises positioning the first test coil and the second test coil positioned along the X and Y axes of each semiconductor device of the array of semiconductor devices on a substrate.

* * * * *